US007514361B2

(12) United States Patent
Bonilla et al.

(10) Patent No.: US 7,514,361 B2
(45) Date of Patent: Apr. 7, 2009

(54) SELECTIVE THIN METAL CAP PROCESS

(75) Inventors: Griselda Bonilla, Fishkill, NY (US); Shyng-Tsong Chen, Rensselaer, NY (US); Matthew E. Colburn, Hopewell Junction, CT (US); Ronald DellaGuardia, Poughkeepsie, NY (US); Chih-Chao Yang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/841,114

(22) Filed: Aug. 20, 2007

(65) Prior Publication Data
US 2009/0053890 A1    Feb. 26, 2009

(51) Int. Cl.
*H01L 21/44* (2006.01)
(52) U.S. Cl. .................. 438/669; 438/622; 438/637; 438/687; 438/694; 257/E21.026; 257/E21.027; 257/E21.597
(58) Field of Classification Search ............. 438/618, 438/622, 625, 626, 637, 638, 674, 675, 945, 438/948, 975, FOR. 435, FOR. 473, 636, 438/642–644, 687, 694, 754, 669, 671, 672; 257/E21.023, E21.231, E21.234, E21.255, 257/E21.026, E21.027, E21.597
See application file for complete search history.

(56) References Cited

U.S. PATENT DOCUMENTS

| 5,454,906 | A | * | 10/1995 | Baker et al. ............ 216/66 |
| 6,174,801 | B1 | * | 1/2001 | Tzu et al. ............. 438/637 |
| 6,358,832 | B1 | | 3/2002 | Edelstein et al. |
| 6,746,904 | B2 | * | 6/2004 | Van der Zaag et al. ...... 438/149 |
| 2005/0001325 | A1 | * | 1/2005 | Andricacos et al. ......... 257/762 |
| 2006/0273431 | A1 | * | 12/2006 | He et al. ............... 257/632 |

* cited by examiner

*Primary Examiner*—Michelle Estrada
*Assistant Examiner*—Quovaunda Jefferson
(74) *Attorney, Agent, or Firm*—Gibb Intellectual Property Law Firm, LLC; Ira D. Blecker, Esq.

(57) ABSTRACT

A method of creating metal caps on copper lines within an inter-line dielectric (ILD) deposits a thin (e.g., 5 nm) metal blanket film (e.g., Ta/TaN) on top the copper lines and dielectric, after the wafer has been planarized. Further a thin dielectric cap is formed over the metal blanket film. A photoresist coating is deposited over the thin dielectric cap and a lithographic exposure process is performed, but without a lithographic mask. A mask is not needed in this situation, because due to the reflectivity difference between copper and the ILD lying under the two thin layers, a mask pattern is automatically formed for etching away the Ta/TaN metal cap between copper lines. Thus, this mask pattern is self-aligned above the copper lines.

6 Claims, 3 Drawing Sheets

SELECTIVE THIN METAL CAP PROCESS

CROSS-REFERENCE TO RELATED APPLICATIONS

This application is related to U.S. patent application Ser. No. 11/622,188, filed on Jan. 11, 2007, having the complete disclosure of which, in its entirety, is herein incorporated by reference.

BACKGROUND AND SUMMARY

The embodiments of the invention provide a metal capping process for a back end of line (BEOL) interconnections.

As wire widths in integrated circuits continue to shrink, the electrical conductivity of the wiring material becomes increasingly more important. The material of choice since the integrated circuit art began, aluminum, is becoming less attractive than other materials, such as gold, copper, and silver, which are better conductors. In addition to possessing superior electrical conductivity, these materials are more resistant than aluminum to electromigration, a property that increases in importance as wire cross-sectional areas decrease and applied current densities increase. In particular, copper is seen as an attractive replacement for aluminum because copper offers low cost, ease of processing, lower susceptibility to electromigration, and lower resistivity.

Metal caps on copper lines improve the electromigration lifetime of the copper significantly. However, a selective metal cap deposition is often difficult to manufacture. Thus, a feasible way to deposit metal caps on copper lines is needed. Further, with metal caps, the current density in the line can be much higher than is desired. Also, some conventional techniques, such as an electroless selective metal capping process, leave a residue and usually produce shorting and reliability problems, especially at thin wire levels.

Thus, this disclosure presents a way to create metal caps on copper lines within an inter-line dielectric (ILD) by depositing a thin (e.g., 5 nm) metal blanket film (e.g., Ta/TaN) on top of the copper lines and dielectric, after the wafer has been planarized in for example, a chemical mechanical planarization process (CMP). Further a thin dielectric cap is formed over the metal blanket film. A photoresist coating is deposited over the thin dielectric cap and a lithographic exposure process is performed, but without a lithographic mask. A mask is not needed in this situation, because due to the reflectivity difference between copper and the ILD lying under the two thin layers, a mask pattern is automatically formed for etching away the Ta/TaN metal cap between copper lines. Thus, this mask pattern is self-aligned above the copper lines.

Since the metal cap deposition is a blanket metal cap deposition, all copper surface will be covered independently of underlying copper line pattern density. One advantage of such processing is that no lithographic mask is required to pattern the photoresist. In addition, with embodiments here no residual is left, unlike conventional electroless processes, which leave a residue. Further, materials such as Ta/TaN for the metal blanket film can stand the stripping process of the remaining photo resist after the etching process is complete.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
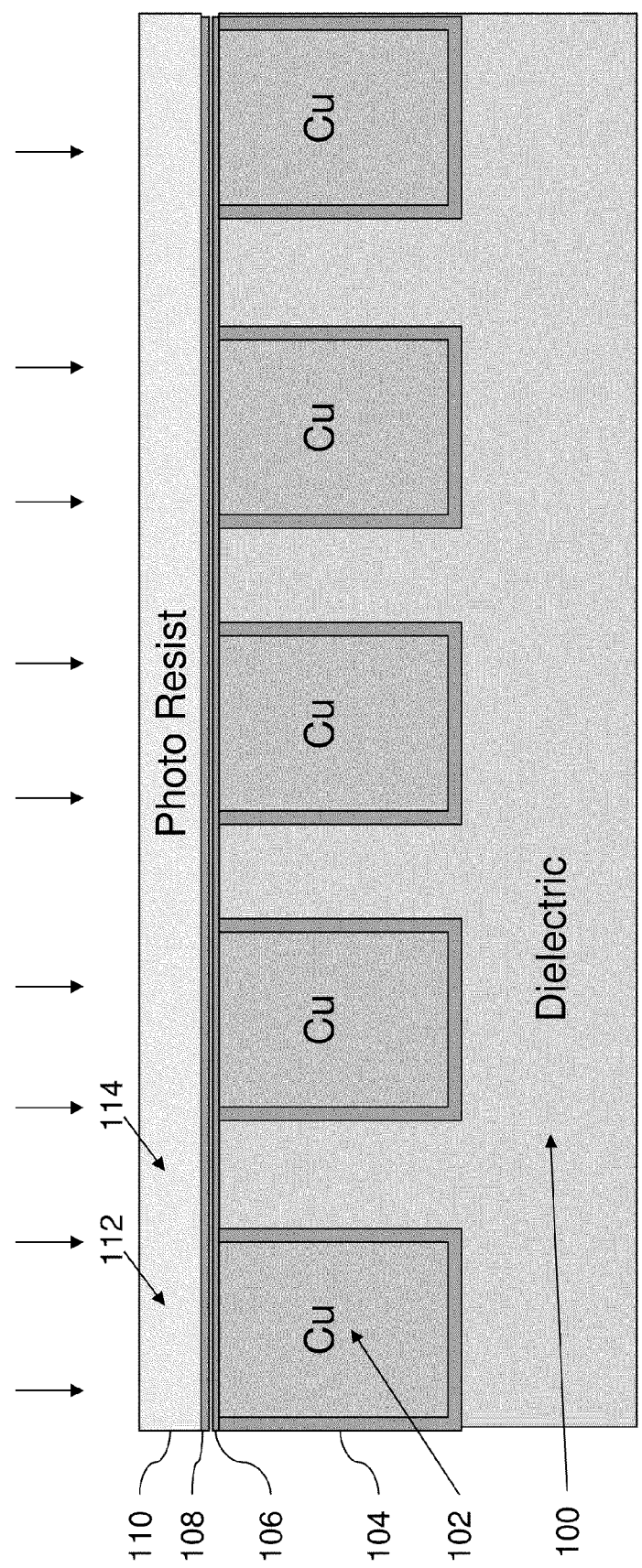
FIG. 1 is a schematic cross-sectional diagram of metal lines in an insulator.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

Figure 2:
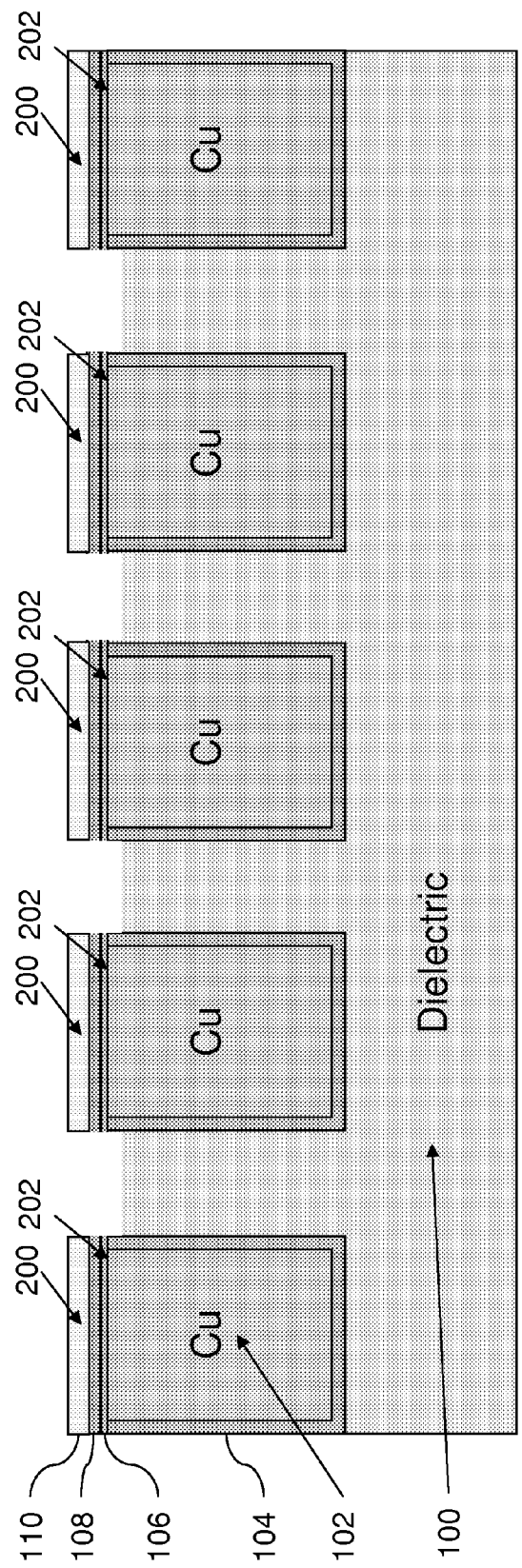
FIG. 2 is a schematic cross-sectional diagram of metal lines in an insulator.
Figure 3:
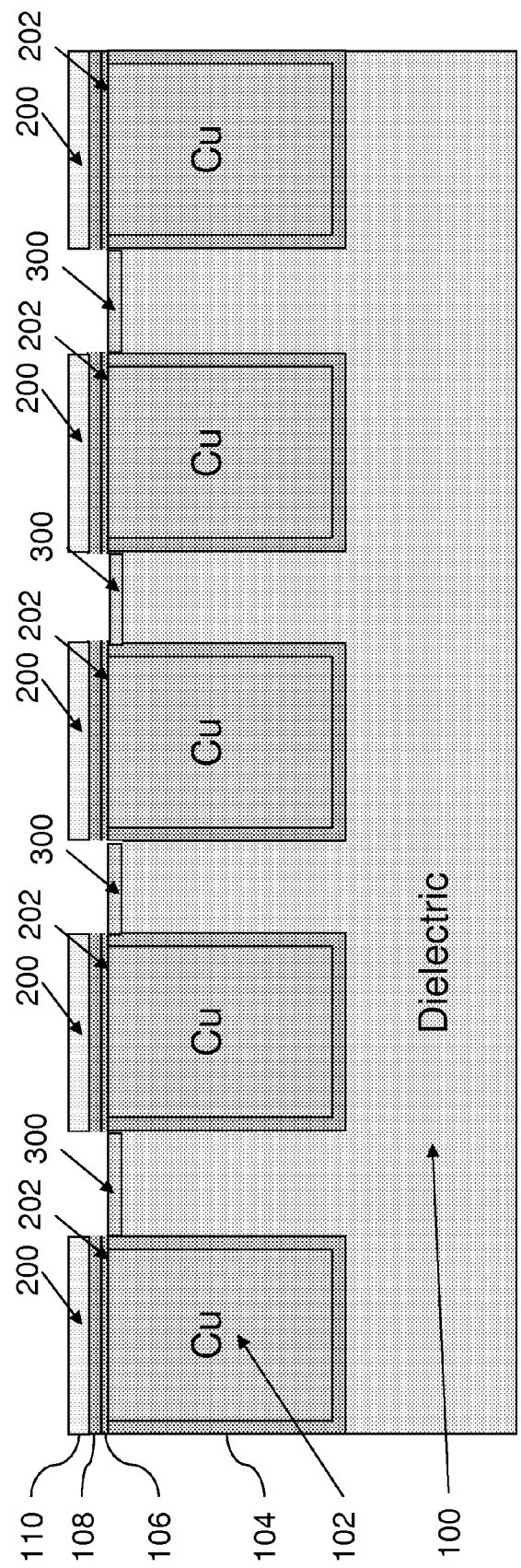
FIG. 3 is a schematic cross-sectional diagram of metal lines in an insulator.

Referring now to FIGS. 1-3, a method of forming metal/dielectric hybrid caps on copper lines is illustrated. More specifically, FIG. 1 illustrates a cross-sectional view of copper lines 102 (also referred to herein as the "metal lines") in upper portions of a dielectric 100 (also referred to herein as an inter-layer dielectric (ILD)). Barrier members 104 are on the bottom and sides of the copper lines 102 such that the barrier members 104 form substantially "U-shaped" structures, when view in cross-section.

The barrier members 104 can be formed from metal, wherein the barrier members 104 separate the copper lines 102 from the dielectric 100. Specifically, inner walls of the barrier members 104 can contact the copper lines 102; and, outer walls of the barrier members 104 can contact the dielectric 100. After CMP is performed, top surfaces of the copper lines 102, the barrier members 104, and the dielectric 100 are coplanar with each other. Details of similar processes are described in U.S. Pat. No. 6,358,832 to Edelstein et al., which is fully incorporated herein by reference.

Thus, FIG. 1 illustrates a process of patterning a dielectric layer 100 to form wire pattern recesses in the dielectric 100, depositing liners 102 within the wire pattern recesses, depositing copper over the liners to fill the wire pattern recesses with copper lines 104, and planarizing the top of the dielectric and the copper lines.

After planarizing, blanket metal layer 106 is deposited on the top surfaces of the copper lines 102, the barrier members 104, and the dielectric 100. The metal layer 106 could be formed from tantalum (Ta) with tantalum nitride (TaNx) and other tantalum alloys, cobalt (Co) with cobalt nitride (CoNx) and other cobalt alloys such as $CoW_xP_yB_z$, titanium (Ti) with titanium nitride (TiNx) and other titanium alloys, ruthenium (Ru) with ruthenium oxide (RuOx), or ruthenium nitride (RuNx) and other ruthenium alloys, rhodium (Rh) with rhodium oxide (RhOx), rhodium nitride (RhNx) and other rhodium alloys, indium (In) with indium oxide (InOx), indium nitride (InNx) and other indium alloys, iridium (Ir) with iridium oxide (IrOx), iridium nitride (IrNx) and other iridium alloys. In the chemical equations used herein, "x", "y", "z", represents any number subscript. Other metals, metal compounds and their oxide and nitride can also be used. The metal layer can be deposited via PVD, CVD, ALD deposition techniques or any other appropriate deposition technique. The total thickness of metal layer is less than 500 A and can be as thin as 20 A with perfect barrier properties. A good example is 20 A Ta dep followed by 30 A TaN dep.

An optional dielectric layer 108 can then be formed on the metal layer 106. The dielectric layer 108 could be formed from thin silicon carbon nitride (SiCN) or silicon carbide with hydrogen (SiCHx); low dielectric constant (low-k) caps such as silicon carbide (SiCx), silicon boron carbide (SiBC), silicon boron nitride (SiBN), boron nitride (BN), and carbon (C); bilayer caps such as low-k layer/SiCN or SiCHx; and, other similar materials.

This dielectric layer 108 is used for photoresist rework to protect the thin metal layer 106. Since metal layer is already a good barrier. This dielectric layer 108 can be thinner than the conventional dielectric cap.

Next, the photoresist 110 shown in FIG. 1 is deposited on the dielectric cap 108 (over the blanket metal layer 106). In FIG. 1, this photoresist 110 is subjected to a blanket exposure process where all portions of the photoresist 110 are exposed, without using a mask (as illustrated by the arrows in FIG. 1). The regions 112 of the photoresist above the copper lines 102 experience more cross linking than areas of the photoresist 114 above the dielectric 100 because of the increase of light reflection (e.g., ultraviolet light) from the upper surfaces of the copper lines 102. A mask is not needed in this situation, because due to the reflectivity difference between copper and the ILD lying under the two thin layers, a mask pattern is automatically formed for etching away the Ta/TaN metal cap between copper lines. Thus, this mask pattern is self-aligned above the copper lines.

As shown in FIG. 2, the photoresist mask 110 is developed and rinsed to remove portions 114 of the photoresist and leave patterned portions 200 of the photoresist only over the copper lines 102. Then, portions of the metal blanket film 106 and dielectric 108 not positioned below the patterned portions 200 of the photoresist are removed in any material removal process such as etching, etc. to pattern said metal blanket film 108 into metal caps 202 above the copper lines.

In addition, as shown in FIG. 3, the embodiments herein can perform an optional ILD surface densification using, for example, a gas cluster ion beam. After these processes are complete, the remaining photo resist can be striped and the next level of ILD can be deposited.

Thus, as shown above, this disclosure presents a way to create metal caps on copper lines within an inter-line dielectric (ILD) by depositing a thin (e.g., 5 nm) metal blanket film (e.g., Ta/TaN) on top of the copper lines and dielectric, after the wafer has been planarized in for example, a chemical mechanical planarization process (CMP). Further a thin dielectric cap is formed over the metal blanket film. A photoresist coating is deposited over the thin dielectric cap and a lithographic exposure process is performed, but without a lithographic mask. A mask is not needed in this situation, because due to the reflectivity difference between copper and the ILD lying under the two thin layers, a mask pattern is automatically formed for etching away the Ta/TaN metal cap between copper lines. Thus, this mask pattern is self-aligned above the copper lines.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A method of forming metal caps over metal lines, said method comprising:
   patterning a dielectric layer to form wire pattern recesses in said dielectric;
   depositing liners within said wire pattern recesses;
   depositing copper over said liners to fill said wire pattern recesses with copper lines;
   planarizing a top of said dielectric and said copper lines;
   depositing a metal blanket film on said dielectric and said copper lines;
   depositing a photoresist on said dielectric cap;
   blanket exposing all portions of said photoresist without using a mask;
   developing and rinsing said photoresist to remove portions of said photoresist and leave patterned portions of said photoresist only over said copper lines; and
   removing portions of said metal blanket film not positioned below said patterned portions of said photoresist to pattern said metal blanket film into metal caps above said copper lines.

2. The method according to claim 1, wherein depositing of said metal blanket film is performed in a manner such that said metal blanket film is between 20 A and 500 A in thickness.

3. The method according to claim 1, wherein said metal blanket film comprises at least one of Ta with TaNx passivation, Co with CoNx passivation, Ti with TiNx passivation, Ru with RuOx or RuNx passivation, Rh with RhOx or RhNx passivation, In with InOx or InNx passivation, and Ir with IrOx or IrNx passivation.

4. A method of forming metal caps over metal lines, said method comprising:
   patterning a dielectric layer to form wire pattern recesses in said dielectric;
   depositing liners within said wire pattern recesses;
   depositing copper over said liners to fill said wire pattern recesses with copper lines;
   planarizing a top of said dielectric and said copper lines;
   depositing a metal blanket film on said dielectric and said copper lines in a manner such that said metal blanket film has a thickness less than 5 nm;
   depositing a dielectric layer over said metal blanket film;
   depositing a photoresist on said dielectric cap;
   blanket exposing all portions of said photoresist without using a mask;
   developing and rinsing said photoresist to remove portions of said photoresist and leave patterned portions of said photoresist only over said copper lines; and removing portions of said metal blanket film not positioned below said patterned portions of said photoresist to pattern said metal blanket film into metal caps above said copper lines.

5. The method according to claim 4, wherein depositing of said metal blanket film is performed in a manner such that said metal blanket film is between 20 A and 500 A in thickness.

6. The method according to claim 4, wherein said metal blanket film comprises at least one of Ta with TaNx passivation, Co with CoNx passivation, Ti with TiNx passivation, and Ru with RuOx or RuNx passivation, Rh with RhOx or RhNx passivation, In with InOx or InNx passivation, and Ir with IrOx or IrNx passivation.

* * * * *